United States Patent
Aschwanden

[11] Patent Number: 6,148,189
[45] Date of Patent: Nov. 14, 2000

[54] AGC CIRCUIT ARRANGEMENT FOR A TUNER

[76] Inventor: Felix Aschwanden, Alpenstrasse 29, Thalwil CH-8800, Switzerland

[21] Appl. No.: 08/930,933

[22] PCT Filed: Apr. 26, 1996

[86] PCT No.: PCT/IB96/00382

§ 371 Date: Oct. 10, 1997

§ 102(e) Date: Oct. 10, 1997

[87] PCT Pub. No.: WO96/34452

PCT Pub. Date: Oct. 31, 1996

[30] Foreign Application Priority Data

Apr. 27, 1995 [GB] United Kingdom .................. 9508592

[51] Int. Cl.⁷ ..................................................... H04B 1/06
[52] U.S. Cl. ..................................... 455/234.1; 455/232.1; 455/234.2; 455/241.1; 381/101; 381/107; 381/102
[58] Field of Search ............................. 455/234.1, 234.2, 455/241.1, 242.2, 243.1, 245.2, 247.1, 232.1, 226.1; 348/678, 679, 682; 375/345; 381/101, 102, 107, 104

[56] References Cited

U.S. PATENT DOCUMENTS

| | | | |
|---|---|---|---|
| 4,138,648 | 2/1979 | Hudspeth et al. ........................ | 330/4.9 |
| 4,263,619 | 4/1981 | Theriault ................................. | 358/196 |
| 4,352,209 | 9/1982 | Ma .......................................... | 455/315 |
| 4,584,544 | 4/1986 | Hittiger .................................... | 333/174 |
| 4,749,974 | 6/1988 | Yamamoto et al. ...................... | 334/56 |
| 4,872,206 | 10/1989 | Graziadei et al. ..................... | 455/247.1 |
| 4,897,624 | 1/1990 | Wignot et al. ............................ | 334/80 |
| 4,956,710 | 9/1990 | Pugel ....................................... | 358/188 |
| 5,001,776 | 3/1991 | Clark ....................................... | 455/226.1 |
| 5,175,883 | 12/1992 | Ueno ....................................... | 455/247.1 |
| 5,398,036 | 3/1995 | Nakase et al. ........................... | 343/860 |
| 5,424,645 | 6/1995 | Doty ........................................ | 324/318 |
| 5,742,899 | 4/1998 | Blackburn et al. .................... | 455/247.1 |
| 5,758,271 | 5/1998 | Rich et al. ............................... | 455/234.1 |
| 5,815,536 | 9/1998 | Yoshinori et al. ..................... | 455/234.1 |
| 5,901,347 | 9/1998 | Chambers et al. ..................... | 455/234.1 |
| 5,995,816 | 11/1999 | Grayson et al. ....................... | 455/234.1 |
| 5,999,578 | 12/1999 | Ha .......................................... | 455/234.1 |
| 6,034,008 | 3/2000 | Kim ......................................... | 455/234.1 |
| 6,044,253 | 3/2000 | Tsumura ................................. | 455/234.1 |
| 6,049,617 | 4/2000 | Sigwanz et al. ........................ | 455/234.1 |

FOREIGN PATENT DOCUMENTS 0455974 11/1991 European Pat. Off. .
5-056434 5/1993 Japan .

OTHER PUBLICATIONS

Copy of search report attached Patent Abstracts of Japan, vol. 017, No. 317, Jul. 13, 1993 and JP 5–056434.
Partial Schematic of Alps Tuner CHR7A749Z, used in Daewood DVR–5280N.

Primary Examiner—Curtis A. Kuntz
Assistant Examiner—Rexford Barnie
Attorney, Agent, or Firm—Joseph S. Tripoli; Robert D. Shedd; Frederick A. Wein

[57] ABSTRACT

A tuner is presented wherein each o a plurality of RF AGC gain controllable amplifiers are individually controlled by individual AGC control signals generated by an AGC controller so that the level of the output signal from each of the RF AGC gain controllable amplifiers is individually optimized for tuner performance.

2 Claims, 3 Drawing Sheets

AGC CIRCUIT ARRANGEMENT FOR A TUNER

FIELD OF THE INVENTION

The present invention concerns an automatic gain control (AGC) arrangement useful in a tuner.

BACKGROUND OF THE INVENTION

Present day tuners do not work sufficiently well for processing digital signals received using various transmission systems. Both the RF and IF characteristics of the receivers need improvement since a digital signal occupies the entire spectrum of a channel, and delay and frequency response errors have a more severe effect on digital signals than on analog signals. Moreover, since the transmitted power of digital signals is considerably less than the transmitted power for analog transmissions, acceptable reception of the desired signal can be more difficult in the presence of strong adjacent channel signals. Further, the signal conditions in the fringe area of over-the-air transmissions are also a problem. For fringe areas, a few tenths of a dB loss of signal-to-noise ratio (SNR) or an increase of intermodulation distortion, can make the signal recovery difficult, if not impossible.

Conventional automatic gain control AGC systems in TV receivers typically are responsive to the level of the demodulated video signal. After comparison of the demodulated video signal with a reference, error voltages are generated to control the gain of the IF amplifier and RF stage of the tuner. To obtain a good SNR over a wide range of input levels, it is a common practice to delay the application of AGC to the tuner until relatively high signal levels are encountered. This works well in the absence of strong adjacent signals. However, if the signal level is low in the presence of strong adjacent signals, cross modulation with the strong adjacent signals could occur in the mixer and the bit error rate (BER) of the demodulated television information would increase.

Typically, there is a single AGC control signal for the IF and a single AGC control signal for the RF, which may or may not be delayed. Additionally, the AGC control signal for the RF typically is derived from the AGC control signal for the IF. Although the relative amplitudes of the AGC control signals can be made different for the various stages by the use of dividers, the overall ratios between the various stages remains constant for various signal levels. More particularly, the AGC control signal for the RF is not individually adjustable according to the characteristics of the input signal, especially for optimizing the tuner characteristics with respect to adjacent channel signals and SNR.

Finally, the ultimate criterion for the quality of digital reception is the BER, which is effected by SNR and intermodulation distortion. Currently, there is much research being conducted to develop improved devices to minimize such difficulties in the tuner. However, even if such new devices are successful, the limitations of the mixer will still be troublesome. Thus, it is desirable that the quality of the signal coupled to various stages of a tuner be optimized independently of the devices used in the various tuner stages.

SUMMARY OF THE INVENTION

A tuner is presented in which there are two separate RF AGC gain controllable amplifier stages desirably separated by a non-AGC gain controllable stage. Each of the RF AGC stages are individually controlled by respective individual AGC control signals generated by an AGC controller so that the level of the output signal from each of the RF AGC gain controllable amplifiers is individually optimized for tuner performance.

DETAILED DESCRIPTION OF THE PREFERRED EMBODIMENT

HARDWARE

Figure 1:
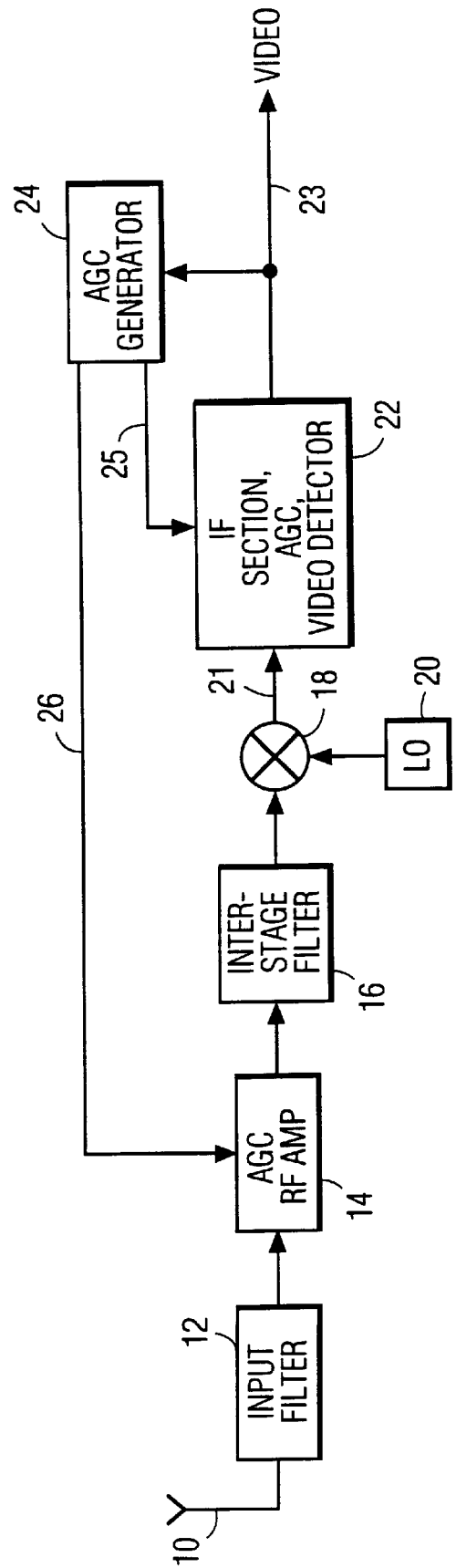
FIG. 1 is a block diagram showing an RF section, an IF section and an AGC section of a receiver according to the prior art.

FIG. 1 shows an RF, IF and AGC circuit arrangement according to the prior art. A signal source is coupled to input 10 and filtered by input filter 12. The signal from input filter 12 is coupled to amplifier 14, the gain of which is AGC controllable. The amplified signal from amplifier 14 is coupled to an interstage filter 16 and to mixer 18 where it is mixed with the signal generated by local oscillator 20 for producing the IF signal at lead 21. The IF signal is processed and amplified by IF section 22 which includes a gain controllable AGC amplifier and a video detector. A detected video output signal at lead 23 is coupled to AGC generator 24 to provide a responsive AGC control signal.

A version of the AGC control signal is coupled to the IF section at lead 25 to adjust the gain of the IF section to keep the video signal at lead 23 at a reasonably constant level for variations of source signal level at RF input terminal 10. If the level of signal at terminal 10 is very high, a delayed AGC control signal is coupled via lead 26 to RF AGC gain controllable amplifier 14. This delayed AGC control signal is derived from the IF AGC control signal except that it is applied when a higher threshold signal level is reached. The delay is provided so that the maximum gain at the amplifier 14 is maintained for as long as possible to maintain a good SNR.

Figure 2:
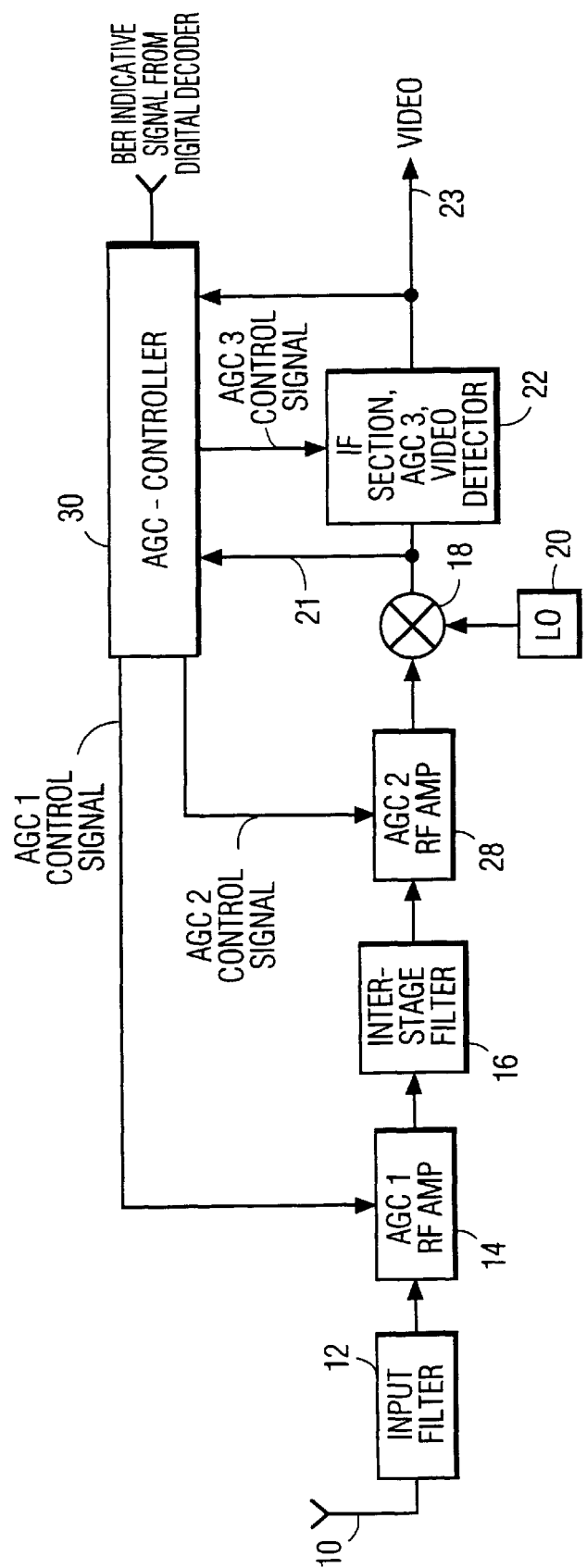
FIG. 2 is a block diagram showing an RF sections an IF section and AGC section of a receiver according to aspects of the present invention.

FIG. 2 shows a circuit arrangement, according to aspects of the present invention, wherein members common with FIG. 1 are given like designations. A second AGC gain controllable amplifier 28 is included in the RF section prior to the mixer. Amplifier 28 is separated from the first AGC controllable amplifier 14 by, in the present embodiment, a non-AGC controllable interstage filter 16, or by a non-AGC controllable amplifier (not shown). In this arrangement, the output signal from amplifier 14 is optimized for the interstage filter 16 and the output signal from the second AGC gain controllable amplifier 28 is optimized for mixer 18. An AGC controller 30 has input signals from lead 21 which couples the converted IF output signal directly from mixer 18, the detected video signal at lead 23, and an indication of the BER from the digital decoder (not shown). In response to these input signals, AGC controller 30 provides individually adjustable AGC 1, 2 and 3 control signals which are coupled to respective AGC 1, 2 and 3 gain controllable amplifiers 14, 28 and 22. AGC controller 30 can include a microprocessor which analyzes the characteristics of its various input signals, as discussed above, and adjusts each of the AGC control signals for providing optimum tuner characteristics according to a conditions programmed into an EPROM (not shown).

Figure 3:
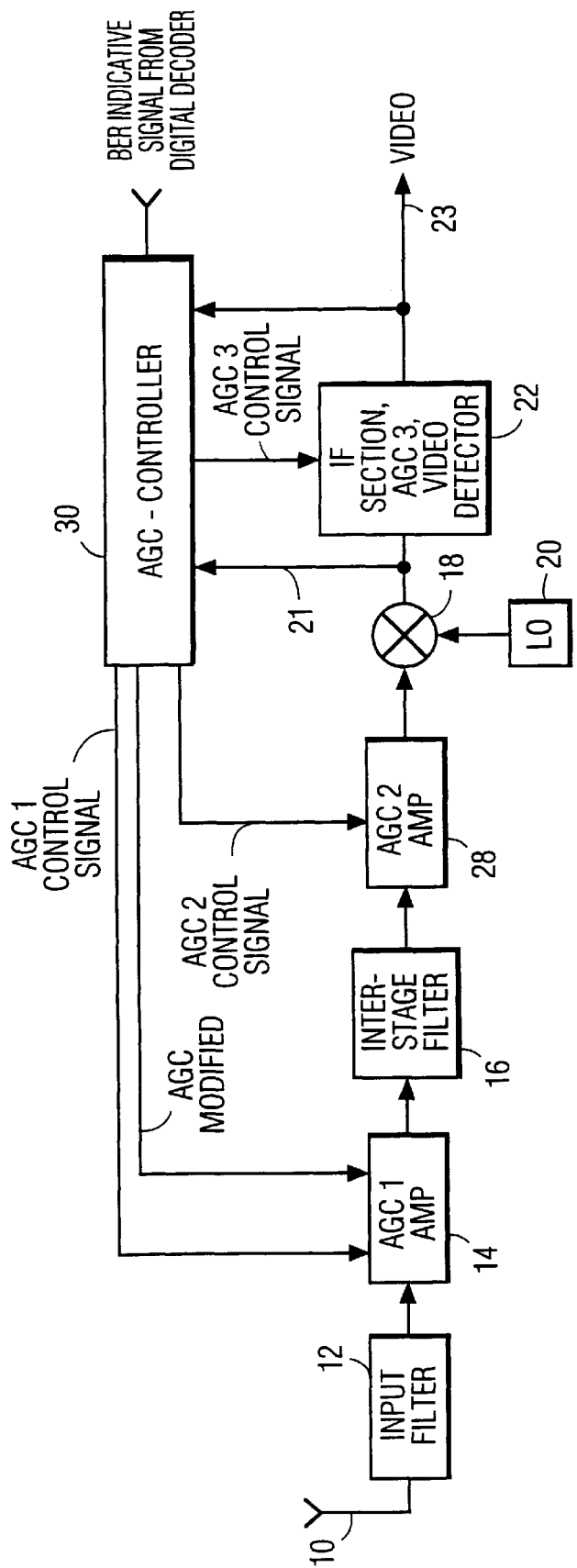
FIG. 3 shows a modification of the AGC arrangement of FIG. 2 according to aspects of the present invention.

FIG. 3 shows a modification of FIG. 2 where an AGC modified control signal is coupled from AGC controller 30 to AGC 1 amplifier 14 in addition to the AGC 1 control signal. An AGC modified control signal is generated by the AGC controller and coupled to the AGC 1 amplifier. This AGC modified control signal: 1) can either modify the operation of the AGC 1 amplifier's response to the AGC 1 control signal, or 2) change the gain of the AGC 1 amplifier in a manner different from the AGC 1 control signal. Further, if warranted, as a third alternative, the AGC 1 stage can be bypassed if the input signal is very strong, e.g., by actuation of a switch, e.g., a diode, in response to the AGC modified signal. Modifications (1) and (2) of the AGC operation on the first AGC amplifier stage would be actuated by the microcontroller only when a weak digital signal is received and a further improvement of the SNR is desirable. The third modification can be initiated when the input signal is so strong that the first AGC amplifier may be overloaded.

Suitable digital decoders for providing the BER signal or the equivalent, i.e., a signal which is indicative of the BER, are a STEL-2030B decoder available from Stanford Telecommunication Company of Sunnyvale, Calif., U.S.A. or an AHA 4210 decoder available from Advanced Hardware Architecture of Pullman, Wash., U.S.A. Such a signal indicative of the BER could be a signal indicative of the amount of error correction being performed or a symbol error signal derived from a Viterbi decoder.

OPERATION

It has been found, according to aspects of the present invention, that the providing of individually adjustable AGC control signals to each of a plurality of AGC adjustable amplifier stages prior to the mixer, improves the performance of the tuner. For example, a 3 dB signal reduction after a tuner first amplifier reduces second order distortions in the output signal from the mixer by 6 dB and third order distortions by 9 dB, with little degradation of the SNR. By distributing the AGC responsive gain reduction over two AGC stages in the tuner before the mixer and one AGC section in the IF section after the mixer, distortions and the BER of the system can be optimized.

The peak signal level of the mixer provides a reasonable criteria for mixer distortions, and such a level can be measured at the unfiltered IF output signal at the mixer. Additionally, as in conventional systems, the level of the output signal at the video detector is also important. The magnitudes of these two signals, i.e., the unfiltered IF output signal at the mixer and the output signal at the video detector, provide information about the nature of the received signal. For example, selecting a channel with a low level signal but with strong adjacent channel signals produces a low level output signal at the video detector and a high level output signal at the mixer. On the other hand, a weak selected signal without adjacent channel signals causes both levels to be low.

From the measured signal levels, an intelligent controller can calculate and adjust the three AGC control signals to substantially reduce distortion. For example, if the attenuation in the second AGC in the tuner is reduced, but the attenuation of the third AGC in the IF is increased to maintain the same signal level, the SNR would improve, but more intermodulation distortion is produced. Once such operations are accomplished, either the BER or a similar error indicative signal, both of which are often readily available from a digital decoder (not shown), could be used as the final criteria for the fine adjustment of the AGC stages, i.e., to verify whether or not the operation was beneficial. For example, if the BER or other error indicative signal is above a threshold, the microprocessor controller modifies the three AGC control signal voltages until the BER becomes minimum or falls below a threshold value.

It should be noted that this arrangement is also applicable to standard analog received signals. The effect on the change of SNR for standard analog reception may be little importance. However, even a slight decrease in SNR can have a detrimental effect for digital signals received at or close to a threshold level. For such a situation, the value of the AGC control signal coupled to the first AGC stage can be chosen so that the gain of the AGC stage is not reduced.

What is claimed is:

1. A signal processing system comprising:

a first AGC means for adjusting the amplitude of a first signal in response to a first AGC control signal and providing an adjusted first output signal;

a first signal processing means for receiving the first adjusted output signal from the first AGC means and providing a first output signal;

a second AGC means for adjusting the amplitude of the first output signal in response to a second AGC control signal and providing a second adjusted output signal;

a mixer means for shifting the frequency of the second adjusted output signal and providing an IF signal;

an IF signal processing means and IF AGC means for respectively processing the IF signal and adjusting the amplitude of the IF signal in response to a third AGC control signal, and providing a third adjusted output signal;

means for generating said first, second and third AGC control signals in response to an output of the mixer; and wherein the means for generating includes a microprocessor which is also responsive to a second characteristic of the third adjusted output signal.

2. The signal processing system of claim 1 wherein the second characteristic is bit error rate.

* * * * *